United States Patent
Fong et al.

(10) Patent No.: US 7,663,426 B2
(45) Date of Patent: Feb. 16, 2010

(54) METHOD AND APPARATUS FOR BIASING CIRCUITS IN RESPONSE TO POWER UP CONDITIONS

(75) Inventors: Richard W. Fong, Markham (CA); Ramesh Senthinathan, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 11/004,725

(22) Filed: Dec. 3, 2004

(65) Prior Publication Data

US 2006/0119416 A1 Jun. 8, 2006

(51) Int. Cl.
*G05F 1/10* (2006.01)
*G05F 3/02* (2006.01)

(52) U.S. Cl. .................... 327/530; 327/408; 327/534
(58) Field of Classification Search ......... 327/407–408, 327/534, 530; 307/112
See application file for complete search history.

(56) References Cited

U.S. PATENT DOCUMENTS

| | | | | |
|---|---|---|---|---|
| 4,812,672 A | * | 3/1989 | Cowan et al. ............. 370/64 |
| 5,272,393 A | * | 12/1993 | Horiguchi et al. ............. 327/63 |
| 5,341,034 A | * | 8/1994 | Matthews .................... 327/534 |
| 5,933,047 A | * | 8/1999 | Zhu et al. .................... 327/534 |
| 6,040,708 A | | 3/2000 | Blake et al. .................... 326/33 |
| 6,160,430 A | | 12/2000 | Drapkin et al. ............. 327/143 |
| 6,359,497 B1 | * | 3/2002 | Criscione .................... 327/408 |
| 6,642,750 B1 | * | 11/2003 | Egan ............................ 327/63 |
| 2003/0201673 A1 | * | 10/2003 | Sim et al. ..................... 307/80 |

\* cited by examiner

*Primary Examiner*—Quan Tra
(74) *Attorney, Agent, or Firm*—Vedder Price P.C.

(57) ABSTRACT

A power up biasing circuit for a split power supply based circuit includes a split power supply state sensing circuit that produces a pair of complimentary control signals indicating a presence or absence of a suitable biasing power supply voltage. A pseudo power supply voltage, based on a first power supply is selected by a selector circuit for acting as a biasing voltage for one or a plurality of components to be protected during initial power up where there is an absence of a second power supply voltage, based on the pair of complimentary control signals. Once the second power supply voltage has fully ramped up to steady state, the selector circuit selects the second power supply voltage as the biasing voltage for one or a plurality of component to be protected.

10 Claims, 11 Drawing Sheets

| Vcntl3_Is | Vcntl2 | 732 | 730 | Enable3 | Enable2 | 738 | 736 |
|---|---|---|---|---|---|---|---|
| 0 | 0 | 0 | 0 | 1 | 1 | 1 | 1 |
| 0 | 0 | 0 | 1 | 1 | 1 | 1 | 0 |
| 0 | 0 | 1 | 0 | 1 | 1 | 0 | 1 |
| 0 | 0 | 1 | 1 | 1 | 1 | 0 | 1 |
| 0 | 1 | 0 | 0 | 1 | 0 | 1 | 1 |
| 0 | 1 | 0 | 1 | 1 | 0 | 1 | 1 |
| 0 | 1 | 1 | 0 | 1 | 0 | 1 | 1 |
| 0 | 1 | 1 | 1 | 1 | 1 | 1 | 1 |
| 1 | 0 | 0 | 0 | 0 | 1 | 1 | 1 |
| 1 | 0 | 0 | 1 | 0 | 1 | 1 | 1 |
| 1 | 0 | 1 | 0 | 0 | 1 | 1 | 1 |
| 1 | 0 | 1 | 1 | 0 | 1 | 1 | 1 |
| 1 | 1 | 0 | 0 | 0 | 1 | 1 | 1 |
| 1 | 1 | 0 | 1 | 0 | 1 | 1 | 1 |
| 1 | 1 | 1 | 0 | 0 | 1 | 1 | 1 |
| 1 | 1 | 1 | 1 | 0 | 1 | 1 | 1 |

FIG. 12

METHOD AND APPARATUS FOR BIASING CIRCUITS IN RESPONSE TO POWER UP CONDITIONS

FIELD OF THE INVENTION

The invention relates generally to methods and apparatus for providing over voltage protection and more particularly to methods and apparatus for biasing circuits in response to power up conditions for split power supply based circuits.

BACKGROUND OF THE INVENTION

In many of today's systems, integrated circuits are required to operate with multiple different voltage power supply levels for portions of circuits, such as core logic, analog circuits and input output interfaces, and any other suitable circuits. This multi-voltage (commonly referred to as "split-rail") requirement is a combination of available power levels, circuit speed requirements, high drive voltage levels, and analog performance requirements. In many scenarios, high voltage supplies with nominal operating voltages that are higher than a transistors over voltage limit are used. An inherent issue with operating multiple voltages is that device voltage over stress can occur causing reliability concerns. For example, gate-junction over stress can be caused by excessive voltages across gate to source or gate to drain junctions, causing gate poly ionic bonds to break down under high electric fields. Drain to source over stress can be caused by high electric fields between the drain to source junction, resulting in impact ionization and punch through break down.

Multi-voltage or split rail circuits may be required, for example, where multiple different power supply voltages may be used by a circuit. For example, on an integrated circuit, core logic may operate at 1.2 volts whereas analog circuits or I/O interfaces on the same integrated circuit may be required to operate at different voltages depending upon the requirements of the system. For example, the analog circuit may be required to operate at 1.8, 3.3 or 5 volt levels. As such, the analog circuits, I/O interfaces or other suitable circuits need to be designed to be able to accommodate the different voltage levels.

A well known technique for overcoming the junction over stresses due to over voltage conditions is the use of series cascode devices, coupled with a limiting bias voltage at a gate of one or more cascoded devices, in order to limit the maximum voltage at the source of the cascode devices. In these scenarios, there is usually a minimum of two different power supply voltage levels that are coupled to the circuit: VDDHI (high voltage power supply level) and VDDLO (low voltage power supply).

During normal operating conditions of the integrated circuit, when both VDDHI and VDDLO have been fully powered up, the use of VDDLO is the limiting voltage on the cascode device to prevent junction over voltage stress. However, higher voltages are often powered up first during system power up to prevent forward conduction of parasitic diodes. As such, VDDHI could have fully ramped to it's nominal operating voltage while VDDLO has yet to begin it's initial ramp up. For this case, no limiting voltage exists on the gate of the cascode device, and the result would be over stress on either the cascode device (NMOS cascode) or the device that is being protected by the cascode transistor (PMOS cascode). As such, thicker gate devices that may use high voltages such as I/O drivers or receivers may require a power supply voltage of 3.3 volts but core logic circuitry may use a lower voltage such as 1.8 volts. When one voltage supply is ramping up and another is at ground level for example, voltage overstress condition of the transistors can occur. In digital to analog converters (DAC) for example such devices may be multi-rail devices. As such multiple simultaneous power supply levels may be used by the device. Sometimes voltage regulators may be off chip and the timing components may be off chip increasing the cost of the system.

A common design work around for this scenario is to require a power up sequencing timing relationship between the ramp up of the VDDHI and VDDLO voltage levels in order to limit the maximum voltage difference between the VDDHI and VDDLO at any time. However, this can result in unnecessary delays in circuit operation. Another method that is used is the use of a series diodes between the two power supply voltages such that their voltage difference does not exceed the diode strong voltage drop. Although helpful, these common prior art solutions may present complexity in the system by requiring for example a BIOS, or other component to control the power up sequencing timing, or can increase the discrete component board space requirements due to the additional diode configurations.

It would be desirable in one case to, among other things, provide an on chip solution that may provide an adequate cascode device bias voltage for the differing bias states during power ramp up, independent of the timing between the ramp up of the differing power voltages. All that may be needed is that the higher voltage may ramp up first, but no specific timing requirements between the ramps would be needed.

BRIEF DESCRIPTION OF THE DRAWINGS

The invention will be more readily understood in view of the following description when accompanied by the below figures and wherein like reference numerals represent like elements:

FIG. 12 is a table illustrating one example of the operation of the encoder shown in FIG. 7.

DETAILED DESCRIPTION OF A PREFERRED EMBODIMENT

Briefly, a power up biasing circuit for a split power supply based circuit includes a split power supply state sensing circuit that produces a pair of complimentary control signals indicating a presence or absence of a suitable biasing power supply voltage. A pseudo power supply voltage, based on a first power supply is selected by a selector circuit for acting as a biasing voltage for a component to be protected, based on the pair of complimentary control signals.

As such, the power up biasing circuit can effectively eliminate the power sequencing requirement between first and second power supply voltages so that the ramp up timing relationship between these two power supply voltages does not have to be precisely controlled. In addition, the power up biasing circuit can eliminate the need for on board diodes in regulating a maximum voltage difference allowed between the first and the second supply voltages. Other benefits will be recognized by those of ordinary skill in the art.

In one embodiment, a method for biasing a split power supply based circuit during power up includes producing a pair of complimentary control signals, based on a pseudo power supply voltage that is based on a power supply voltage. The first power supply voltage is applied first during power up. The complimentary control signals indicate a presence or absence of a second power supply voltage, reaching for example a desired level, and the method includes switching from the pseudo power supply voltage to the second power voltage based on the pair of complimentary control signals.

In another embodiment, a circuit is disclosed that accommodates more than two power supplies and suitably switches a biasing voltage to bias for example cascoded devices during for example power up, to provide a type of power up over voltage protection.

Figure 1:
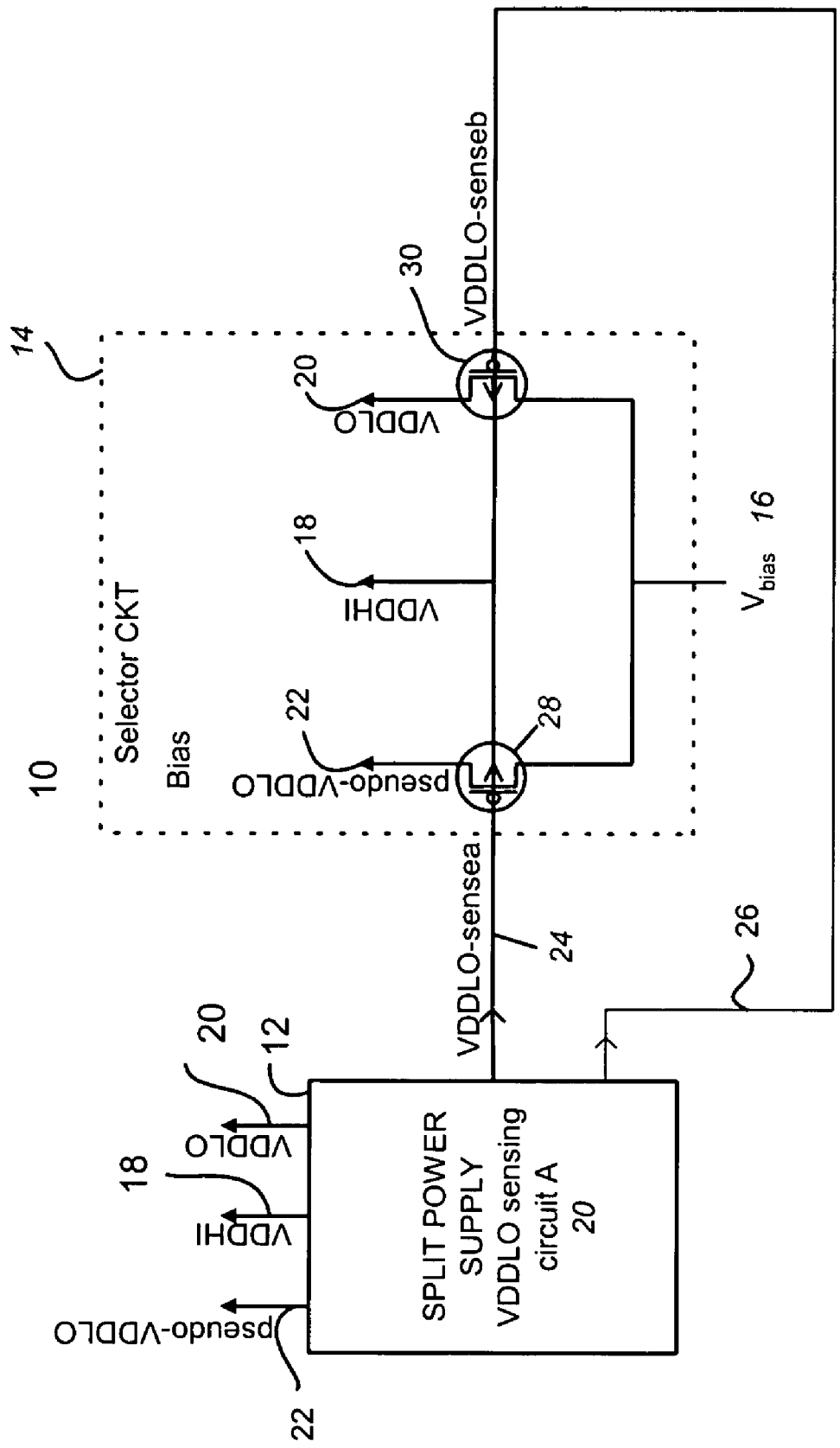
FIG. 1 is a block diagram illustrating one example of a power up biasing circuit in accordance with one embodiment of the invention.

FIG. 1 is a block diagram of a power up biasing circuit 10 for a split power supply based circuit, such as cascoded devices, or any other suitable circuit that employs two or more supply voltages at the same time. For example, there are at least two power supply voltages connected to the power up biasing circuit 10.

The power up biasing circuit 10 includes a split power supply state sensing circuit 12 and a bias selector circuit 14 that outputs a bias voltage 16 for biasing MOS devices or any other suitable devices that require over voltage protection.

The split power supply state sensing circuit 12 includes a plurality of inputs (such as input nodes) that receive for example a first power supply voltage 18 and a second and lower power supply voltage 20 referred to as VDDHI and VDDLO respectively. As such, the power supply voltage 20 is lower than the power supply voltage 18. For example, the power supply voltage 18 may be, for example, 5 volts or 3.3 volts and the lower voltage supply 20 may be, for example, 3.3 or 1.8 volts respectively. However, it will be recognized as any suitable voltage levels may be used. The split power supply state sensing circuit 12 also receives a pseudo power supply voltage 22 that is based on the first power supply voltage 18. The split power supply state sensing circuit 12 produces a pair of complimentary control signals 24 and 26 such as inverted signals which indicate a presence or absence of a desired level of the second power supply voltage 20.

The bias selector circuit 14 receives the complimentary control signals 24 and 26 and also includes a plurality of inputs, each for example that receive the first and second supply voltages 18 and 20 and the pseudo power supply voltage 22. An output node of the bias selector circuit outputs either the second power supply voltage 20 which is the lower voltage of the power supply voltages or the pseudo power supply voltage, as the bias voltage 16 based on the pair of complimentary control signals 24 and 26.

In this example, the bias selector circuit includes a pair of PMOS transistors 28 and 30 respectively wherein PMOS transistor 28 includes a gate operatively coupled to the power supply sensing circuit 12 and a source operatively coupled to receive the pseudo power supply voltage 22, a bulk operatively coupled to receive the first power supply voltage 18 and a drain operative to provide the bias voltage 16. The PMOS transistor 30 includes a gate operatively coupled to receive one of the complimentary control signals from the split power supply sensing circuit 12 and has a bulk that is coupled to the bulk of the PMOS transistor 28. The PMOS transistor 30 has a source operative to receive the second power supply voltage 20. As such, each of the PMOS transistors 28 and 30 have gates that receive one of the complimentary control signals 24 and 26. The complimentary control signals 24 and 26 effectively turn on one of the PMOS transistors 28 and 30 while shutting off the other so that either the pseudo power supply voltage 22 or the second power supply voltage 20 is output as the output voltage or bias voltage 16.

Figure 2:
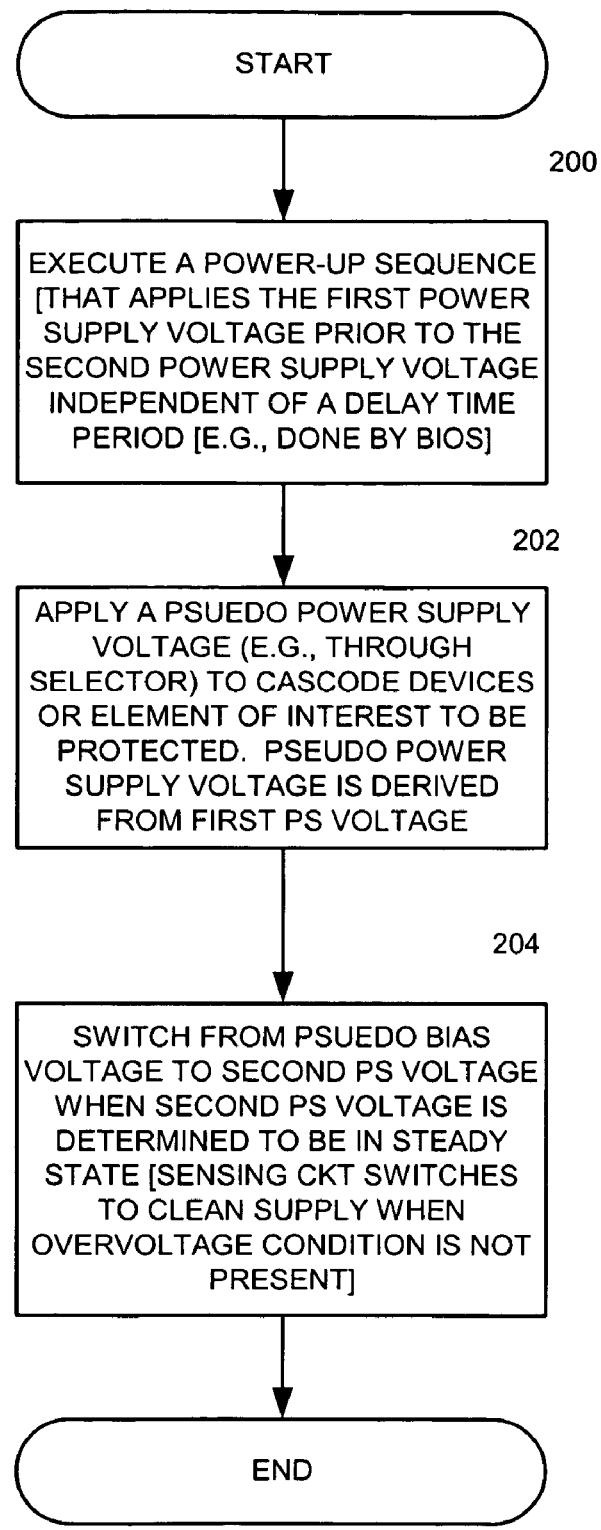
FIG. 2 is a flow chart illustrating an example of a method for biasing a split power supply based circuit in accordance with one embodiment of the invention.

FIG. 2 is a flowchart illustrating one example of a method for biasing a split power supply based circuit, such as a circuit having cascoded PMOS and NMOS transistors, or any other suitable circuit, during power up. As shown in block 200, the method begins by executing a power up sequence, such as controlled through a BIOS operation in the case where the system includes BIOS based power up control. The power up sequence merely needs to apply the first power supply voltage 18 prior to the second power supply voltage 20. This can be done independent of a delay time, between the ramping up of the two voltages unlike prior art systems. As shown in block 202, the method includes applying a pseudo power supply voltage to for example cascode devices or other elements of interest to be protected. The pseudo power supply voltage is based on the higher power supply voltage namely the first power supply voltage 18. The generation of the pseudo power supply voltage as the bias voltage is provided by for example producing a pair of complimentary control signals that are produced in response to sensing the presence or absence of the second power supply voltage reaching its steady state. The production of the pair of complimentary control signals is done based on the pseudo power supply voltage level. Turning to block 204, the method includes switching from the pseudo power supply voltage, as the bias voltage 16, to the second power supply voltage based on a pair of complimentary control signals. This method is done independent of any timing control or constraints between the ramping up of the first power supply voltage and the second power supply voltage. As such, the executing of the power up sequence that applies the first power supply voltage prior to the second power supply voltage is independent of any delay time period between the ramp up of the two power supply voltages.

Figure 3:
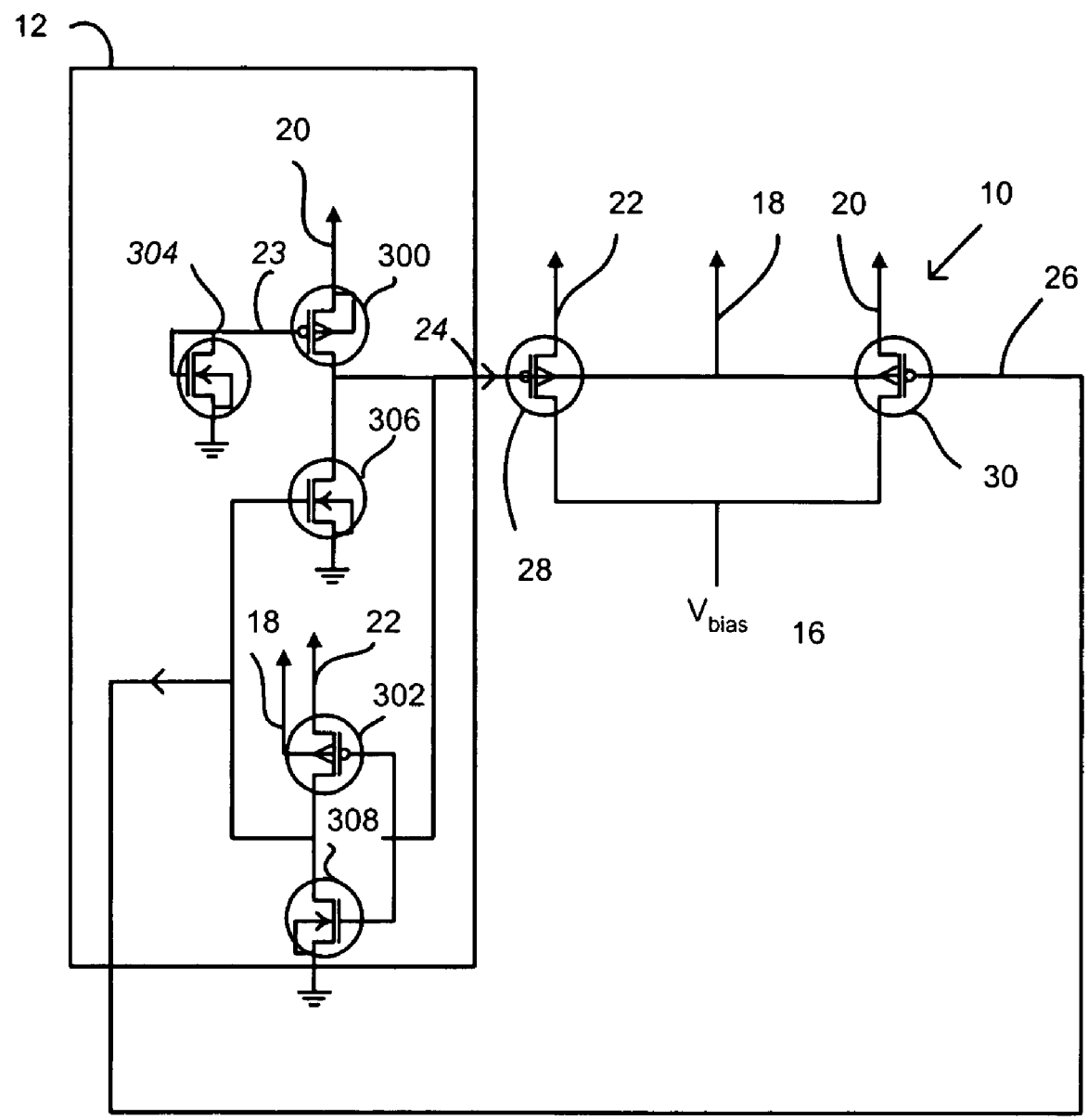
FIG. 3 is a circuit diagram illustrating one example of a power up biasing circuit in accordance with one embodiment of the invention.

FIG. 3 shows in more detail an example of a split power supply sensing circuit 12 in accordance with one embodiment of the invention. The split power supply sensing circuit 12 acts to sense when the lower of the two power supply voltages, namely power supply voltage 20 (or VDDLO) has not reached its steady state. During this time, the complimentary control signals cause the bias voltage 16 to be the pseudo power supply voltage. The pseudo power supply voltage is operative as the bias voltage 16 until the second power supply voltage 20 reaches a steady state condition at which time the complimentary control signals switch to allow the bias voltage 16 to be sourced by the second power supply voltage 20. The split power supply sensing circuit 12 includes operatively coupled PMOS transistor 300, PMOS transistor 302, NMOS transistor 304, NMOS transistor 306 and NMOS transistor 308. In this particular example, PMOS transistor 300 has a gate coupled to a gate and drain of NMOS transistor 304 and a source and bulk coupled to a second power supply voltage 20. PMOS transistor has a drain operative to provide a first of the complimentary control signals, namely complimentary control signal 24. NMOS transistor 304 has a gate and a drain coupled to the gate of the PMOS transistor 300. A source and bulk of the NMOS transistor 304 are coupled to a ground voltage potential and in this example are shown being coupled to ground potential.

The NMOS transistor 306 has a drain operatively coupled to a drain of PMOS transistor 300 and a gate operative to provide complimentary control signal 26, and a source and bulk operatively coupled to each other and in this example, operatively coupled to a ground potential. PMOS transistor 302 has a source that receives the pseudo power supply voltage 22 and a bulk coupled to receive the first power supply voltage 18 and a drain operatively coupled to the gate of the NMOS transistor 306 and a gate operatively coupled to the drain of PMOS transistor 300. NMOS transistor 308 has a gate operatively coupled to the gate of the PMOS transistor 302, a drain coupled to the drain of PMOS transistor 302 and a source and bulk operatively coupled to each other, and in this case, to the ground potential. It will be recognized that as shown and described, certain nodes of the circuit are operative to receive the power supply voltages, and ground potential. NMOS transistor 304 acts as a type of the low device for PMOS transistor 300.

It should be noted that the bulk of the bias selector circuit PMOS devices are connected to the highest supply rail, the first power supply voltage 18, to prevent parasitic junction bulk diode forward conduction under any circumstances, at the absence of the second power supply voltage being present in the pseudo power supply voltage being present, if for example, the pseudo power supply voltage were to shut off after the second power supply voltage rams up.

Figure 4:
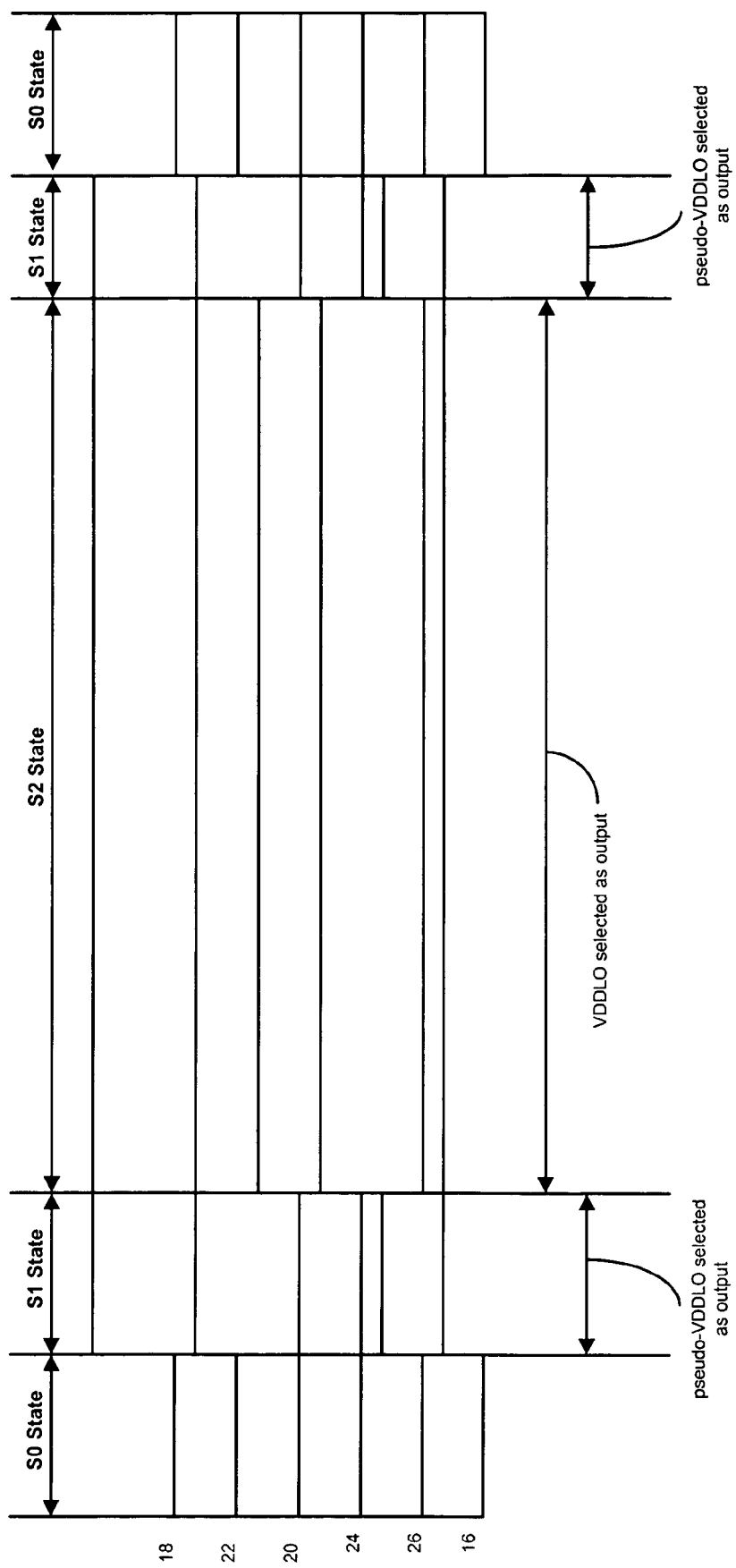
FIG. 4 is a timing diagram showing the various states of various power supply sources over varying operational time periods.

FIG. 4 is a timing diagram illustrating the operation of the device shown in FIGS. 1 and 3 for example. As shown, the pseudo power supply voltage is selected as the output VBIAS voltage until the VDDLO power supply level is at a desired state. In this case the desired state is the steady state of the VDDLO power supply.

Figure 5:
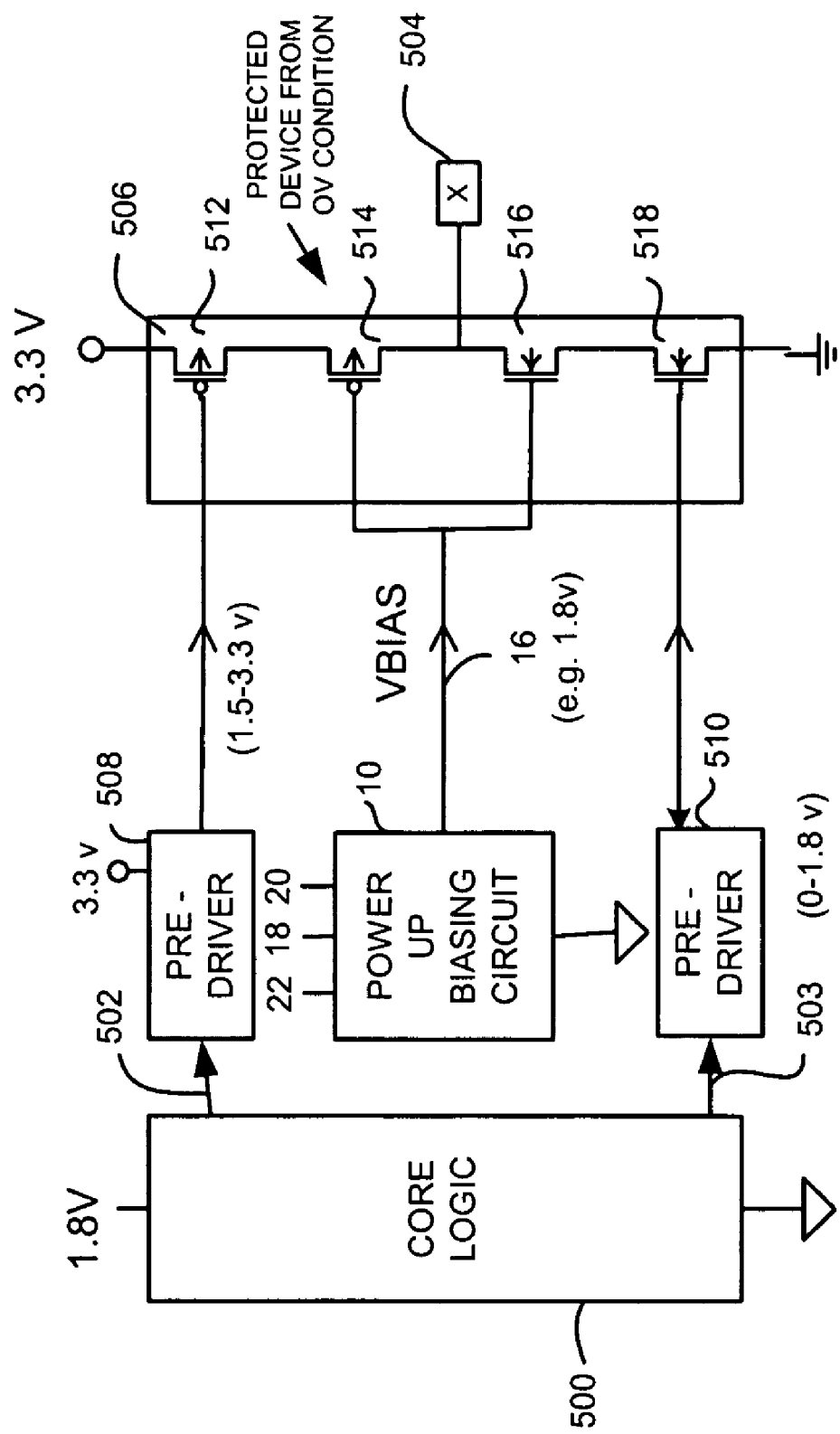
FIG. 5 is a block diagram illustrating one example of a power up biasing circuit applied to cascode transistors in accordance with one embodiment of the invention.

FIG. 5 is a block diagram illustrating one example of a power biasing circuit applied to cascode transistors in an output buffer in accordance with the one embodiment to the invention. However it will be recognized that the power biasing circuit described herein may be applied to any suitable circuit. In this particular example, core logic 500 may be coupled to a power supply voltage of for example, 1.8 volts and outputs data for a, I/O buffer, (input buffer circuit not shown). The core logic 500 outputs output data 502 which will be output via pad 504 through an output buffer 506. If desired, a pre-driver circuit 508 on both the high side output and a pre-driver circuit 510 on the low side output may be used which may include for example, level shifting logic as known in the art that may suitably shift the level of the data 502 to a suitable level to affect the turning on or off of a respective drive transistor in the output buffer. In this example, the output buffer 506 includes a pair of series cascoded PMOS transistors 512 and 514 and a pair of series cascoded NMOS transistors 516 and 518. Power up biasing circuit 10 outputs the bias voltage 16 for respective cascoded PMOS and NMOS transistors 514 and 516 to protect them from over voltage stress. In this example the pre-driver circuit 508 is coupled to a 3.3 volt source and outputs a suitable level signal to turn on and shut off PMOS transistor 512

As shown, in operation, if the core logic wishes to output a logic high output from the buffer 506, data out 502 will be a logical low and data out 503 will be a suitable level to control transistor 518 to be off so that PMOS transistors 512 and 514 are turned on to pull the output voltage to a high level. Likewise, when a low output voltage is to be output on the pad 504, the core logic 500 may output a suitable level that is data out 503 to turn on transistor 518 to pull a output voltage on pad 504 to a low level. During operation, the bias voltage 16 is set for example to maintain a 1.8 volt level to ensure suitable operation and to prevent over voltage conditions on, for example, transistor 514.

As shown, the cascode structure of MOS transistors in the output buffer are operatively coupled to the output of the bias selector circuit 10 and receive either the pseudo bias voltage or the second power supply voltage as a supply voltage, in this case shown as the V bias voltage 16. As such, FIG. 5 shows an integrated circuit, such as a graphics processor or the circuit that includes core logic that receives a power supply voltage, such as 1.8 volts or any other suitable voltage, cascode output buffer logic 506 and a power up bias circuit 10. The power up bias circuit includes the split power supply state sensing circuit and bias selector described above. If desired, intermediate pre-driver circuitry may be used to provide suitable level shifting of input signals to the output buffer as desired.

Figure 6:
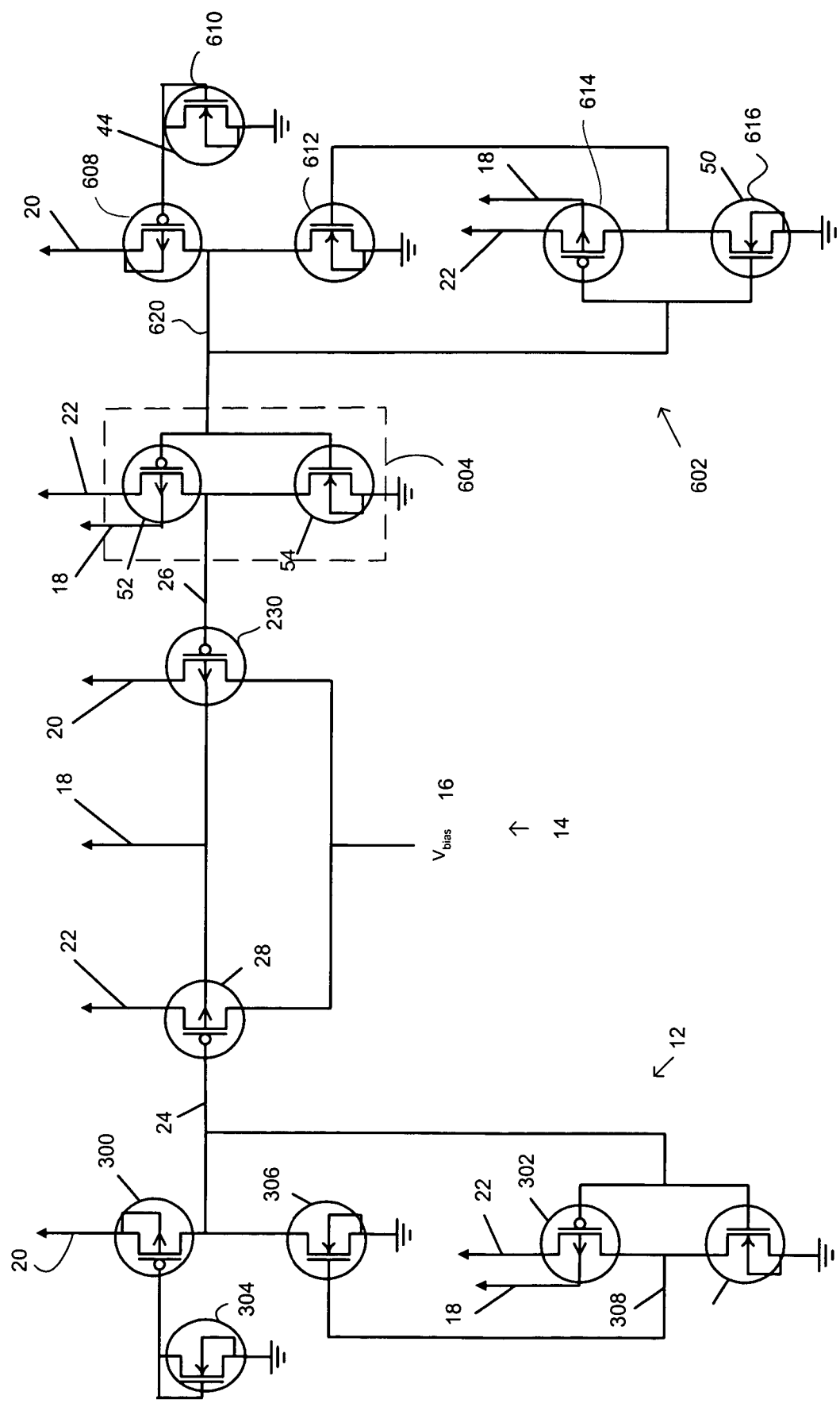
FIG. 6 is another example of a power up biasing circuit in accordance with one embodiment of the invention.

FIG. 6 is a circuit diagram illustrating another example of a power up biasing circuit 600 that employs a plurality of split power supply state sensing circuits 12 and 602. The split power supply state sensing circuit 12 is similar to that shown in FIG. 3 except the gate of NMOS transistor 306 is not coupled to the gate of PMOS transistor 30 of the bias selector circuit 14. Instead, another split power supply state sensing circuit 602 is employed in addition to an inverter 604.

As with the split power supply state sensing circuit 12, the split power supply sensing circuit 602 also includes a PMOS transistor 608, NMOS transistor 610, NMOS transistor 612, PMOS transistor 614 and NMOS transistor 616. These devices are operatively coupled as shown and as previously described, for example, with respect to FIG. 3. In this example, the sensed output level at node 620 serves as an input to the inverter 604 and the output of inverter 604 serves as one of the complimentary control signals, here shown as complimentary control signal 26. As such the split power supply sensing circuit 600 includes at least two power supply sensing circuits each operative to generate a respective one of the complimentary control signals.

Figure 7:
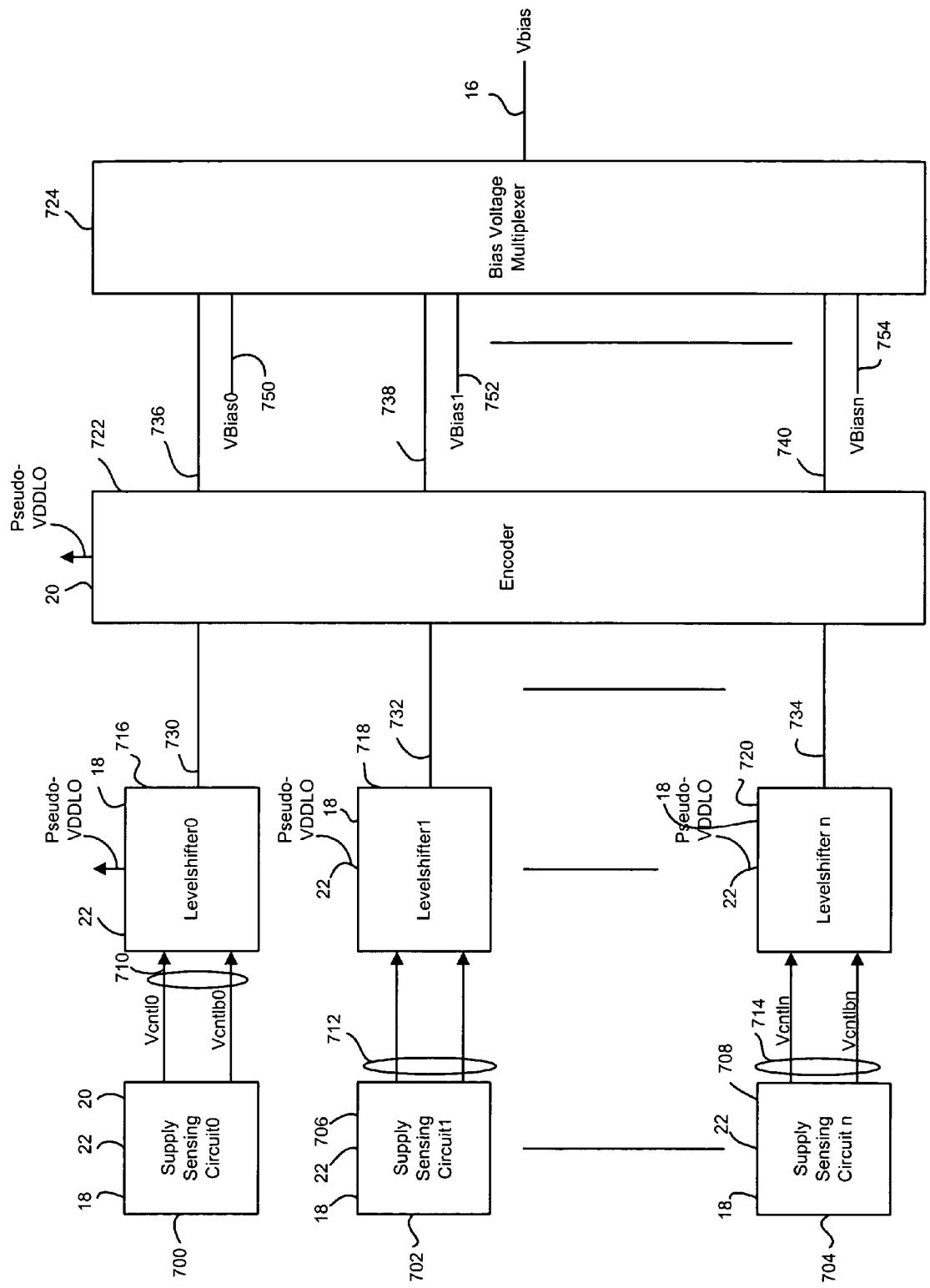
FIG. 7 is a block diagram illustrating another example of a power up biasing circuit having more than two power supply voltages.

FIG. 7 is another embodiment which shows a block diagram illustrating embodiment where more than two supply voltages are being sensed and wherein a suitable bias voltage 16 is being output for coupling to a suitable cascode device or any other suitable device. In this example, the circuit includes a plurality of supply sensing circuits 700, 702, 704 each coupled to the same or different pseudo power supply voltage (s) and the first power supply voltage since the pseudo supply voltage (s) is (are) derived from first power supply voltage. Each supply sensing circuit may then be coupled to a different supply voltage that is to be sensed, such as supply voltage 706 and another supply sensing circuit 704 may receive another supply level 708. Each supply sensing circuit, outputs a pair of complimentary control signals 710, 712 and 714 respectively, for corresponding level shifter circuits 716, 718 and 720 respectively. Each of the level shifter circuits 716, 718 and 720 receive the pseudo power supply voltage 22. This way, at the output of the level shifter circuits, signals 730, 732, and 734 have the same logic voltages. The level shifter circuits are used to increase, if necessary an output signal voltage to be at a suitable level that is understood by an encoder 722. The output of the encoder 722 serves as input to a bias voltage multiplexor 724 which outputs a bias voltage 16 selected from a plurality of bias voltages. As with the supply sensing circuit 10 of FIG. 1, the complimentary control signals indicate a presence or absence of the second supply voltage which in this case are shown to be supply voltage 20, 706 and 708. In this example, the bias voltage multiplexor 724 serves as a bias selector circuit.

Each level shifter 716, 718 and 720 outputs a level shifted output signal 730, 732 and 734 respectively for input to the encoder 722. The encoder 722 receives the pseudo supply voltage 20 and outputs a plurality of control signals 736, 738 and 740 to the bias voltage multiplexor 724. FIG. 12 illustrates one example of a truth table responding to the operation of the encoder 722 when there are 4 supply sensing circuits. Bias voltage multiplexor 724 receives a plurality of different input bias voltages 750, 752, 754 and selects one of the plurality bias voltages as the output bias voltage 16 based on the control signal 736 through 740 from the encoder 722.

Figure 8:
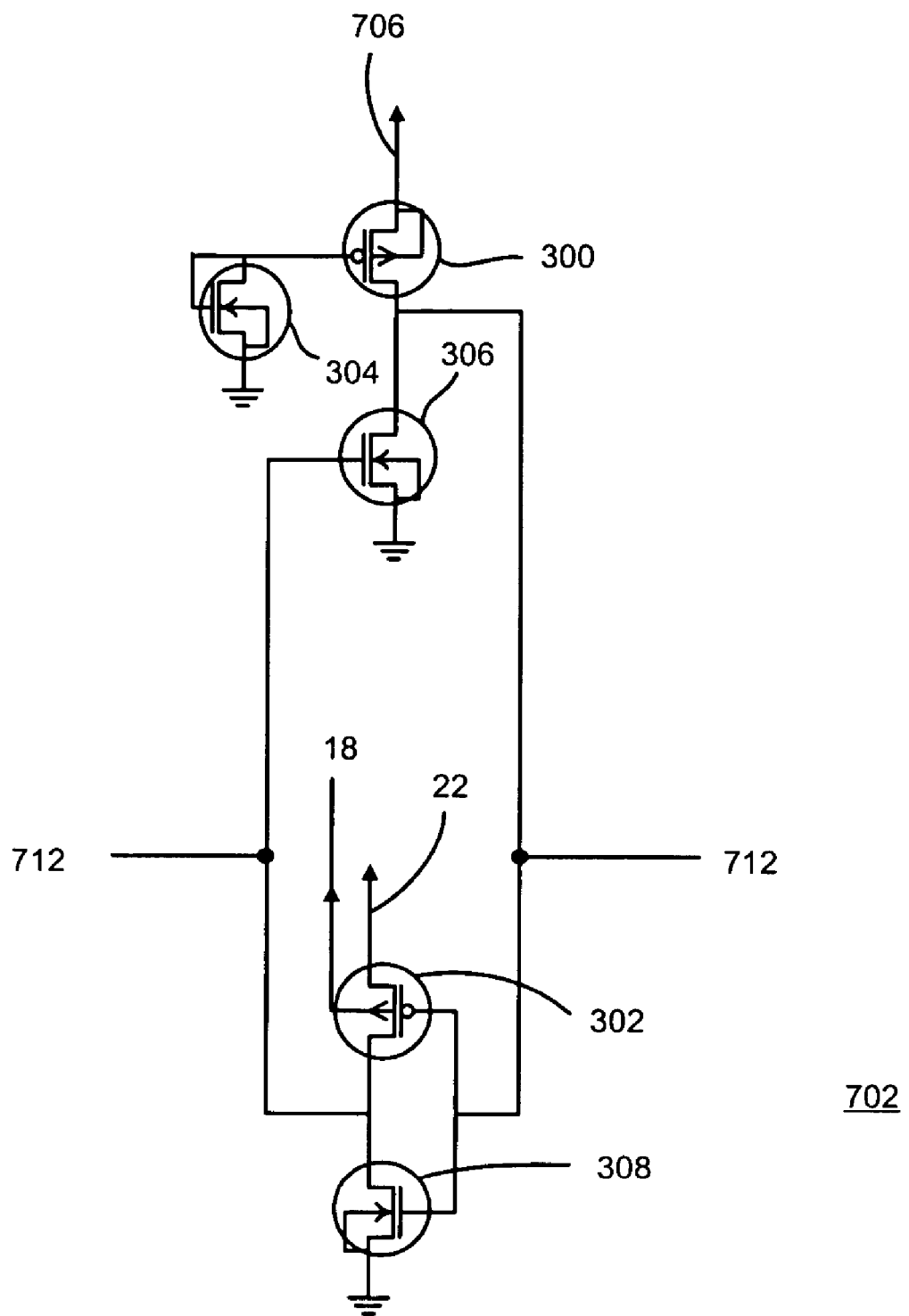
FIG. 8 is one example of a supply sensing circuit shown in FIG. 7.

FIG. 8 illustrates one example of a supply sensing circuit 700, 702 and 704 that may be used for example with the embodiment shown in FIG. 7. With the supply sensing circuit 702, the supply voltage being sensed may be even lower than the supply voltage 20. The supply sensing circuit 702 may use the same structure for example as the supply sensing circuit shown for example, FIG. 3.

Figure 9:
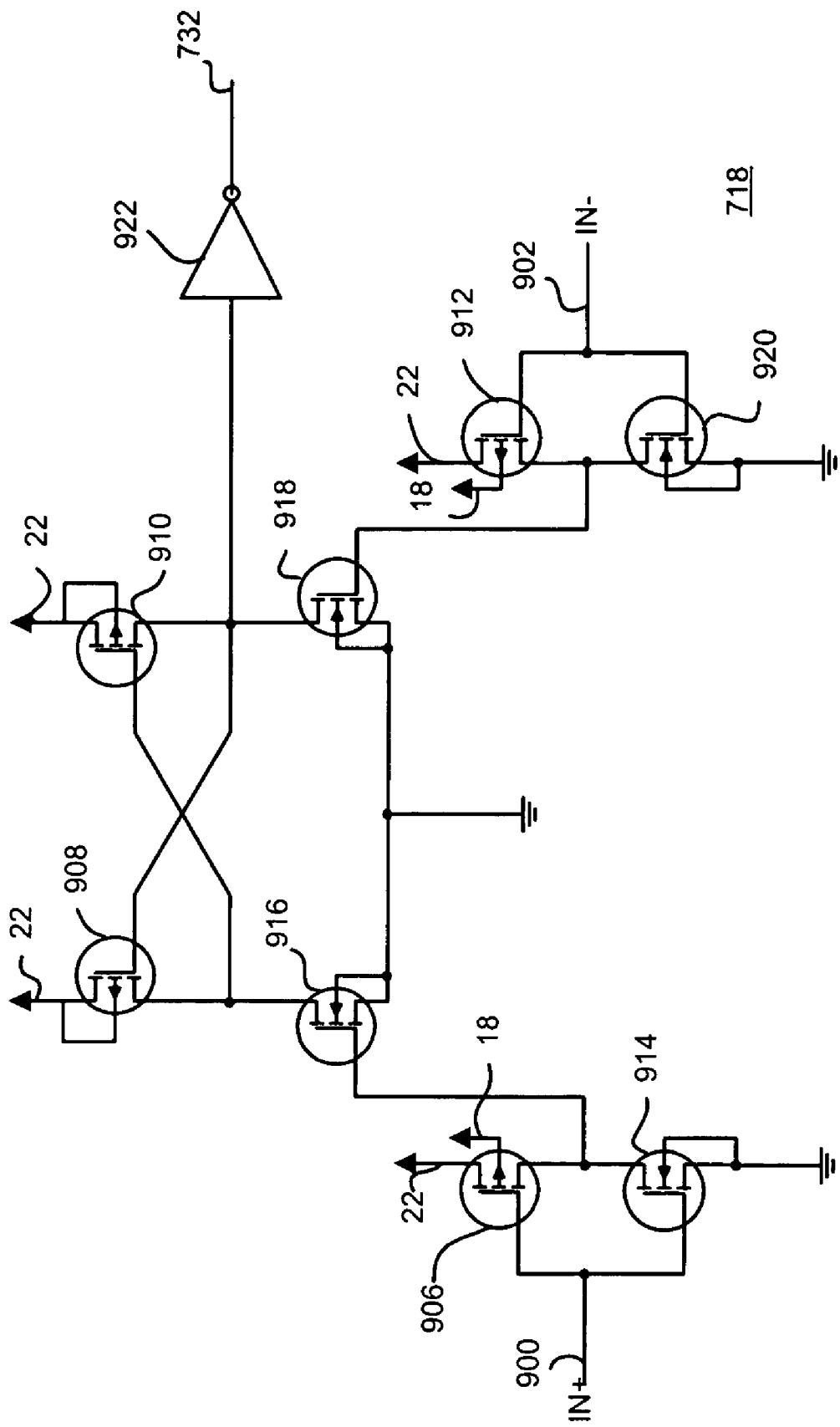
FIG. 9 is a circuit diagram illustrating one example of a level shifter shown in FIG. 7.

FIG. 9 is one example of a level shifter 716, 718, or 720. However it will be recognized as any suitable shifting circuit may be used. In a case where the level shifter is level shifter 718, the level shifter 718 receives the control signals 712 shown as IN+ and IN− 900 and 902 and outputs the level shifter control signals 732 for the encoder 722. The level shifter 718 for example may include a plurality of PMOS transistors 906, 908, 910 and 912 and NMOS transistors 914 916, 918 and 920 operatively coupled as shown. In addition, an inverter 922 is operatively coupled to transistors 910 and 918 and produces the level shifted output voltage 732.

Figure 11:
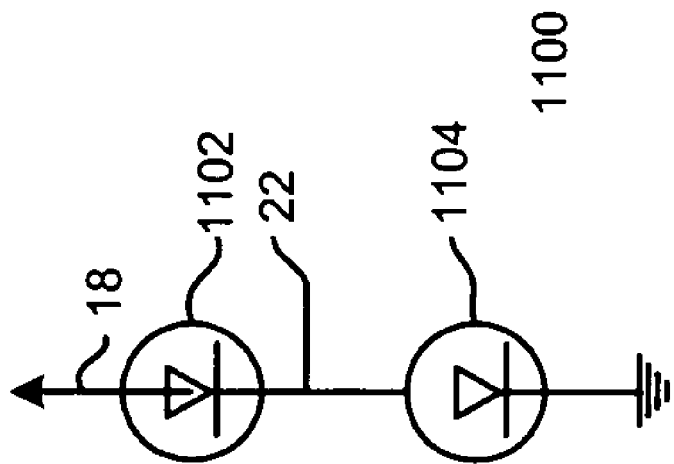
FIGS. 10 and 11 illustrate pseudo power supply voltage generators in accordance with different embodiments of the invention.
Figure 10:
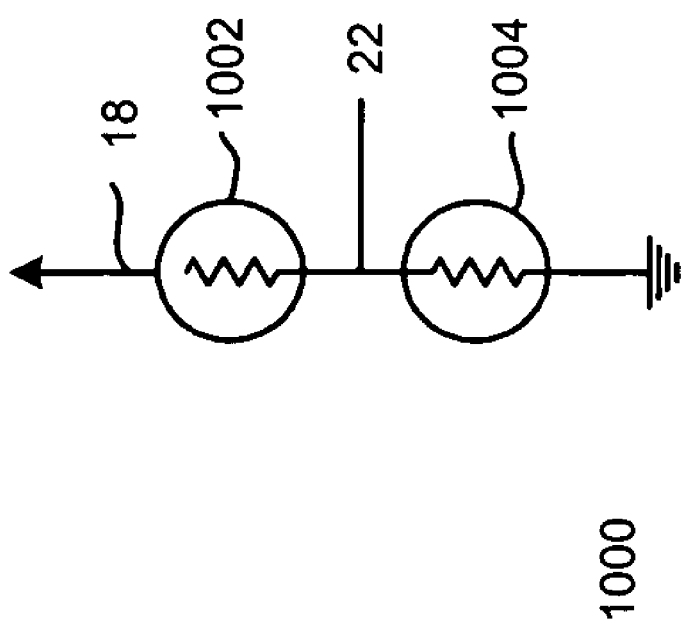

FIGS. 10 and 11 illustrate by way of example pseudo power supply voltage generating circuits 1000 and 1100 respectively. As shown, the pseudo power supply voltage generating circuits receive the first power supply voltage, in this example, the higher the power supply voltage is, which is controlled to be applied first, prior for example to another power supply voltage such as power supply voltage 20. As shown in FIG. 10 a simple resistor divider that includes a plurality of resistors 1002 and 1004 may be used as a divider circuit to generate the pseudo power supply voltage 22. Similarly, a plurality of diodes 1102 and 1104 (see FIG. 11) may be used to generate a pseudo power supply voltage 22. However it will be recognized that any suitable generating circuits may also be employed.

As such, as disclosed herein a pseudo power supply voltage that has approximately the same voltage as a nominal second supply voltage is generated from a first supply voltage based on for example, a voltage ratio. An automatic bias voltage selection circuit selects the pseudo power supply voltage as a cascode bias voltage when a low supply voltage (the second supply voltage for example) is inactive or deactivated, and automatically switches to the lower power supply voltage when the lower power supply voltage were ramped up to a nominal or steady state voltage level. Once the second power supply voltage has ramped to its nominal value, a pseudo power supply voltage portion of the circuit is completely isolated from an output bias node completing the automatic voltage selection. The reverse operation occurs for powering down a system. The output of the automatic bias selection circuit provides bias voltages for operational amplifiers, analog bias circuits, and output buffers or any other suitable logic at any time to eliminate voltage over stress conditions with or without a second supply voltage being active. Other advantages will be recognized by those of ordinary skill in the art.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A power up biasing circuit for a split power supply based circuit comprising:

a split power supply state sensing circuit comprising a plurality of inputs operative to receive at least a first power supply voltage, a second power supply voltage that is lower than the first power supply voltage and a pseudo power supply voltage wherein the pseudo power supply voltage is based on the first power supply voltage, and operative to produce a pair of complementary control signals indicating a presence or absence of the second power supply voltage;

a bias selector circuit, operatively coupled to the split power supply state sensing circuit, having at least a first input operatively coupled to the second power supply voltage and a second input operatively coupled to the pseudo power supply voltage and at least one output operative to output either the second power supply voltage or the pseudo power supply voltage based on the pair of complementary control signals; and wherein the split power supply sensing circuit comprises:

a first PMOS transistor having a gate, source and bulk coupled to receive the second supply voltage, and drain operative to provide a first of the complementary control signals;

a first NMOS transistor having a gate and drain operatively coupled to the gate of the first PMOS transistor and a source and bulk operatively coupled to receive a ground voltage potential;

a second NMOS transistor having a drain operatively coupled to the drain of the first PMOS transistor, a gate operative to provide a second of the complementary control signals and a source and bulk operatively coupled to each other;

second PMOS transistor having a source operative to receive the pseudo power supply voltage, a bulk operatively coupled to receive the first power supply voltage, a drain operatively coupled to the gate of the second NMOS transistor, and a gate operatively coupled to the drain of the first PMOS transistor;

a third NMOS transistor having a gate operatively coupled to the gate of the second PMOS transistor, a drain operatively coupled to the drain of the second PMOS transistor and a source and bulk operatively coupled to each other.

2. The circuit of claim 1 wherein the bias selector circuit comprises:

a third PMOS transistor having a gate operatively coupled to the drain of the first PMOS transistor, a source operative to receive the pseudo power supply voltage, a bulk, and drain as the output;

a fourth PMOS transistor having a gate operatively coupled to the gate of the second NMOS transistor, a bulk operatively coupled to the bulk of the third PMOS transistor and operative to receive the first power supply voltage, a drain operatively coupled to the drain of the third PMOS transistor and a source operative to receive the second power supply voltage.

3. A power up biasing circuit for a split power supply based circuit comprising:
   a split power supply state sensing circuit comprising a plurality of inputs operative to receive at least a first power supply voltage, a second power supply voltage that is lower than the first power supply voltage and a pseudo power supply voltage wherein the pseudo power supply voltage is based on the first power supply voltage, and operative to produce a pair of complementary control signals indicating a presence or absence of the second power supply voltage;
   a bias selector circuit, operatively coupled to the split power supply state sensing circuit, having at least a first input operatively coupled to the second power supply voltage and a second input operatively coupled to the pseudo power supply voltage and at least one output operative to output either the second power supply voltage or the pseudo power supply voltage based on the pair of complementary control signals; and
   wherein the bias selector circuit has at least a third input operatively coupled to the first power supply voltage.

4. The circuit of claim 3 including a pseudo power supply generating circuit operatively coupled to the first power supply voltage and to a ground voltage and operative to produce the pseudo power supply voltage.

5. The circuit of claim 3 wherein the split power supply sensing circuit comprises at least two power supply sensing circuits, with an additional inverter to one of the power supply sensing circuit, each operative to generate a respective one of the complementary controls signals.

6. The circuit of claim 3 including a cascode structure of MOS transistors operatively coupled to the output of the bias selector circuit and operative to receive either the pseudo bias voltage or the second power supply voltage from the output as a bias voltage.

7. An integrated circuit comprising:
   first logic operative to receive a first power supply voltage;
   cascode output buffer logic;
   second logic, interposed between the first logic and the cascode output buffer logic and comprising:
   a split power supply state sensing circuit having a plurality of inputs operative to receive at least a second power supply voltage, a third power supply that is lower than the second power supply voltage and a pseudo power supply voltage wherein the pseudo power supply voltage is based on the second power supply voltage, and operative to produce a pair of complementary control signals indicating a presence or absence of the third power supply voltage;
   a bias selector circuit, operatively coupled to the split power supply state sensing circuit and to the cascode output buffer logic, having at least a first input operatively coupled to the third power supply voltage and a second input operatively coupled to the pseudo power supply voltage and at least one output operative to output either the third power supply voltage or the pseudo power supply voltage based on the pair of complementary control signals; and
   wherein the bias selector circuit has at least a third input operatively coupled to the first power supply voltage.

8. A power up biasing circuit for a split power supply based circuit comprising:
   a plurality of split power supply state sensing circuits each having a plurality of inputs operative to receive at least a first power supply voltage, a second power supply voltage that is lower than the first power supply voltage, a third power supply voltage and a pseudo power supply voltage wherein the pseudo power supply voltage is based on one of the first power supply voltage and third power supply voltage, and operative to produce a pair of complementary control signals indicating a presence or absence of the second power supply voltage;
   a bias selector circuit, operative coupled to receive a plurality of bias voltages and a plurality of control signals, and operative to output one of the plurality to bias voltage based on the plurality of control signals; and
   a plurality of voltage level shifting circuits, each operatively coupled to the pseudo supply voltage and to receive an output voltage from a corresponding split power supply state sensing circuit, and operative to produce a level shifted output signal.

9. The circuit of claim 8 comprising;
   an encoder, operatively coupled to the pseudo supply voltage, the bias selection circuit and to the plurality of voltage level shifting circuits, and operative to produce a plurality of control signals;
   bias voltage multiplexor, operatively coupled to receive the plurality of control signals and operatively coupled to receive a plurality of bias voltages, and operative to select an output bias voltage from among the plurality of bias voltages based on the received control signals.

10. The power up biasing circuit of claim 3 wherein the bias selector circuit is operative to provide the pseudo power supply voltage as the output until the second power supply reaches a steady state.

* * * * *